United States Patent
Tomisawa et al.

(10) Patent No.: US 8,253,489 B2
(45) Date of Patent: Aug. 28, 2012

(54) AMPLIFIER, TRANSMITTER, AND METHOD FOR COMPENSATING GAIN

(75) Inventors: Fumihiro Tomisawa, Kawasaki (JP); Tatsuhiko Tajima, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/756,295

(22) Filed: Apr. 8, 2010

(65) Prior Publication Data

US 2010/0289585 A1 Nov. 18, 2010

(30) Foreign Application Priority Data

May 18, 2009 (JP) .................................. 2009-120189

(51) Int. Cl.
*H03G 3/20* (2006.01)
(52) U.S. Cl. ........................................ 330/140; 330/129
(58) Field of Classification Search .................. 330/129, 330/140, 279, 285
See application file for complete search history.

(56) References Cited

U.S. PATENT DOCUMENTS

| | | | | |
|---|---|---|---|---|
| 4,360,787 A | * | 11/1982 | Galpin | 330/284 |
| 5,426,641 A | * | 6/1995 | Afrashteh et al. | 370/347 |
| 6,801,088 B2 | * | 10/2004 | Allen et al. | 330/277 |
| 7,230,492 B2 | | 6/2007 | Benelbar | |
| 7,595,692 B2 | * | 9/2009 | Ishida | 330/279 |
| 7,795,965 B2 | * | 9/2010 | Suzuki et al. | 330/59 |
| 2004/0212432 A1 | | 10/2004 | Takahashi et al. | |
| 2007/0066250 A1 | | 3/2007 | Takahashi et al. | |

FOREIGN PATENT DOCUMENTS

| | | |
|---|---|---|
| EP | 1 411 632 | 4/2004 |
| JP | 8-32357 | 2/1996 |
| JP | 10-51324 | 2/1998 |
| JP | 10-294628 | 11/1998 |

OTHER PUBLICATIONS

European Search Report dated Aug. 24, 2010, from the corresponding European Application.

* cited by examiner

*Primary Examiner* — Robert Pascal
*Assistant Examiner* — Khiem Nguyen
(74) *Attorney, Agent, or Firm* — Fujitsu Patent Center (57) ABSTRACT

An amplifier includes a voltage detector that detects current flowing to a drain terminal of a transistor which amplifies a signal using GaN as a voltage difference by means of voltage conversion, a compensation decision unit that decides whether or not to perform gain compensation based on the voltage difference detected by the voltage detector, and a gain compensation unit that performs the gain compensation according to the voltage difference when the compensation decision unit decides to perform the gain compensation.

6 Claims, 6 Drawing Sheets

AMPLIFIER, TRANSMITTER, AND METHOD FOR COMPENSATING GAIN

CROSS-REFERENCE TO RELATED APPLICATION

This application is based upon and claims the benefit of priority of the prior Japanese Patent Application No. 2009-120189, filed on May 18, 2009, the entire contents of which are incorporated herein by reference.

FIELD

The embodiment discussed herein is directed to an apparatus such as an amplifier for amplifying a signal.

BACKGROUND

In recent years, amplifiers using a device such as a FET (Field Effect Transistor) circuit element are employed in wireless base stations for sending and receiving communication signals. Previously, amplifiers using a device such as LDMOS-FET and GaAs-FET have been employed. Recently, however, amplifiers using a highly efficient GaN-HEMT (Gallium Nitride High Electron Mobility Transistor) capable of operating at lower power than the previous amplifiers are becoming mainstream. In the explanation hereinafter, an amplifier using a GaN-HEMT device is denoted as a high power amplifier.

However, the aforementioned high power amplifier causes an Idq drift when the amplifier controls the output level of the GaN-HEMT device from high power to low power. In the Idq drift, an idle current (Idq) becomes equal to or lower than a prescribed value. Such an Idq drift causes the gain of the GaN-HEMT device to fluctuate by a large degree.

Although a small gain fluctuation in a general amplifier is compensated in an existing apparatus, a large gain fluctuation caused by the Idq drift is not compensated in the existing apparatus. Therefore, when a large gain fluctuation occurs by the Idq drift, control for compensating the fluctuation becomes unstable. As a result, it takes time until the compensation of the gain fluctuation is completed (as examples of conventional technology, see Japanese Laid-open Patent Publication No. 08-32357, and Japanese Laid-open Patent Publication No. 10-294628).

SUMMARY

According to an aspect of an embodiment of the invention, an amplifier includes a voltage detector that detects current flowing to a drain terminal of a transistor which amplifies a signal using GaN as a voltage difference by means of voltage conversion, a compensation decision unit that decides whether or not to perform gain compensation based on the voltage difference detected by the voltage detector, and a gain compensation unit that performs the gain compensation according to the voltage difference when the compensation decision unit decides to perform the gain compensation.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENT(S)

Preferred embodiments of the present invention will be explained with reference to accompanying drawings. It should be noted that the present invention is not limited by this embodiment.

First, before explaining the embodiment of the present invention, the Idq drift of GaN-HEMT is explained. The Idq drift is a phenomenon that an idle current (Idq) at the initial setting of a GaN-HEMT device, for example, in a high power amplifier fluctuates under various conditions. The idle current corresponds to a drain current in the condition where a signal is not applied to the GaN-HEMT device.

One condition for causing the Idq drift is that the output level of the high power amplifier is decreased, for example, from a rated output level to a level 20 dB lower than a dynamic range predetermined by the specifications of the apparatus. Such Idq drift occurs prominently when the GaN-HEMT device is at a low temperature, and does not occur when the GaN-HEMT device is at a high temperature.

Figure 1:
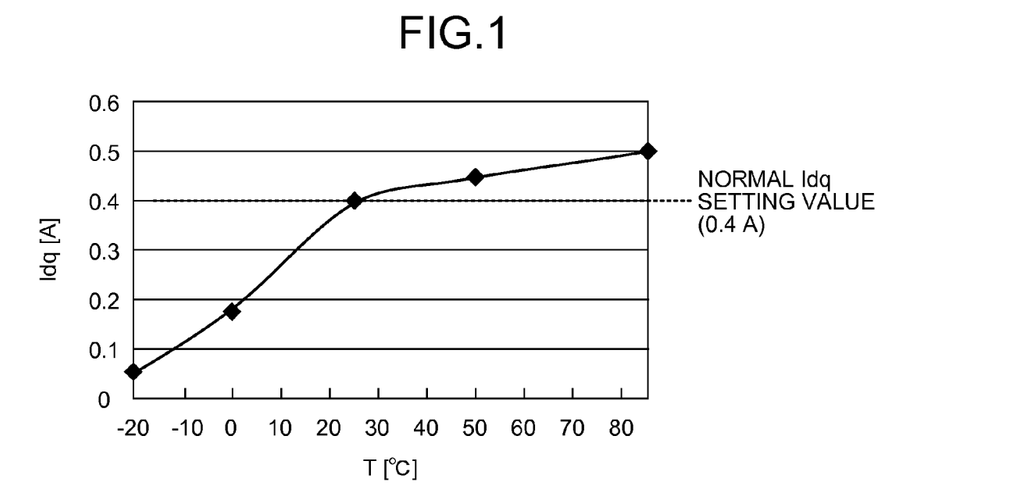
FIG. 1 is a graph illustrating a relation between the idle current Idq and the temperature T of GaN-HEMT.

FIG. 1 is a graph illustrating a relation between idle current Idq and temperature T of GaN-HEMT. As illustrated in FIG. 1, setting value of the normal idle current of a GaN-HEMT device is 0.4 A. The idle current lowers significantly with a decrease of the temperature of the GaN-HEMT device. For example, when the temperature of the GaN-HEMT device is as low as −20° C., the idle current of the GaN-HEMT device becomes 0.05 A. On the other hand, variation amount of the idle current with an increase of the temperature of the GaN-HEMT device is small.

Figure 2:
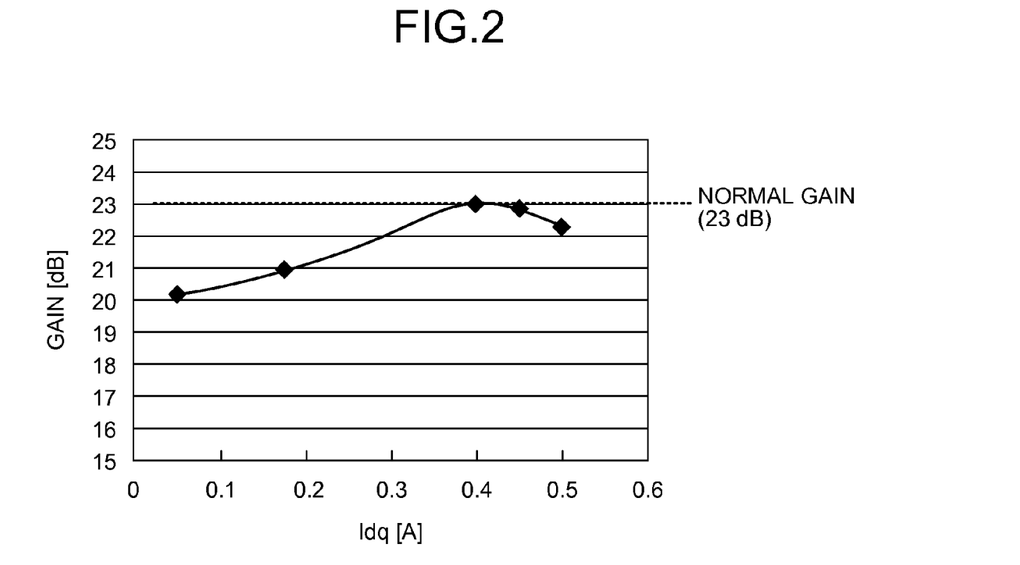
FIG. 2 is a graph illustrating a relation between the idle current Idq and the gain of GaN-HEMT.

FIG. 2 is a graph illustrating a relation between the idle current Idq and the gain of GaN-HEMT. As illustrated in FIG. 2, the normal gain of the GaN-HEMT device is about 23 dB. However, the gain of the GaN-HEMT device decreases significantly when the output level is lowered while the idle current is low after the idle current decreases because of the effect of temperature drop. For example, if the output level is lowered when the idle current is 0.05 A, the gain of the GaN-HEMT device drops from the normal 23 dB to 20 dB. On the other hand, a large gain fluctuation does not occur at high temperature, because the variation amount of the idle current along with an increase of the temperature of the GaN-HEMT device is small.

Figure 3:
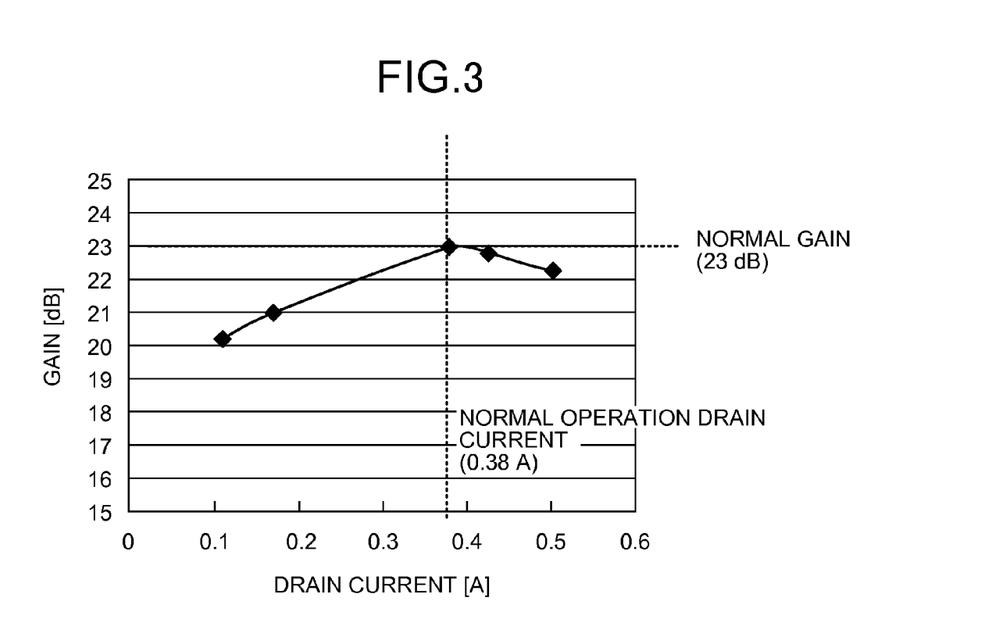
FIG. 3 is a graph illustrating a relation between a drain current Idq input in a GaN-HEMT device and the gain.

Next, a relation between the gain and the drain current input to the GaN-HEMT device when the Idq drift occurs is explained. FIG. 3 is a graph illustrating a relation between the drain current Idq input to the GaN-HEMT device and the gain. As illustrated in FIG. 3, the normal gain of the GaN- HEMT device is about 23 dB. When the drain current input to the drain terminal of the GaN-HEMT device falls, the gain drops.

Here, when comparing FIG. 2 and FIG. 3, it is found that the relation between the idle current and the gain correlates with the relation between the drain current and the gain. Therefore, it is considered that the gain of the GaN-HEMT device drops because of the Idq drift when the value of the drain current falls below the prescribed value. Because the idle current represents a current in the situation when the current is not input to the GaN-HEMT device, it is not possible to perform gain compensation by monitoring the idle current itself.

On the other hand, the drain current can be monitored even when the current is input to the GaN-HEMT device. Therefore, if the gain compensation is performed dynamically based on the drain current, a large fluctuation in the gain of the GaN-HEMT device due to the Idq drift can be prevented.

Figure 4:
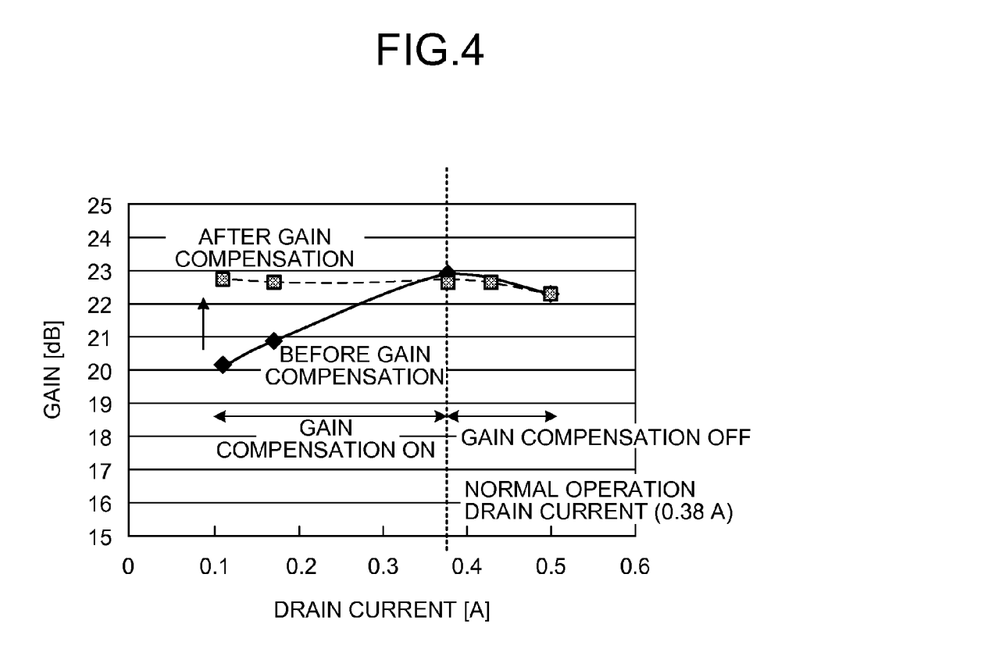
FIG. 4 is a graph for illustrating an outline of a transmitter according to an embodiment of the present invention.

Next, an outline of a transmitter according to the embodiment of the present invention is explained. FIG. 4 is a diagram for illustrating an outline of a transmitter according to the embodiment of the present invention. As illustrated in FIG. 4, the transmitter according to the embodiment of the present invention monitors the drain current input to the drain terminal of the GaN-HEMT device and decides whether the value of the drain current becomes lower than a prescribed value or not. If the value of the drain current becomes lower than the prescribed value, the transmitter performs gain compensation dependent on the drain current.

For example, in FIG. 4, when the drain current is 0.1 A, the gain of the GaN-HEMT device drops from 23 dB to 20 dB. Hence, when the drain current is found to be 0.1 A as a result of monitoring of the drain current, the transmitter performs gain compensation so that the gain returns to 23 dB.

As described above, the transmitter according to the embodiment of the present invention can prevent the large fluctuation of the gain of the GaN-HEMT device caused by the Idq drift by performing gain compensation based on the drain current.

Figure 5:
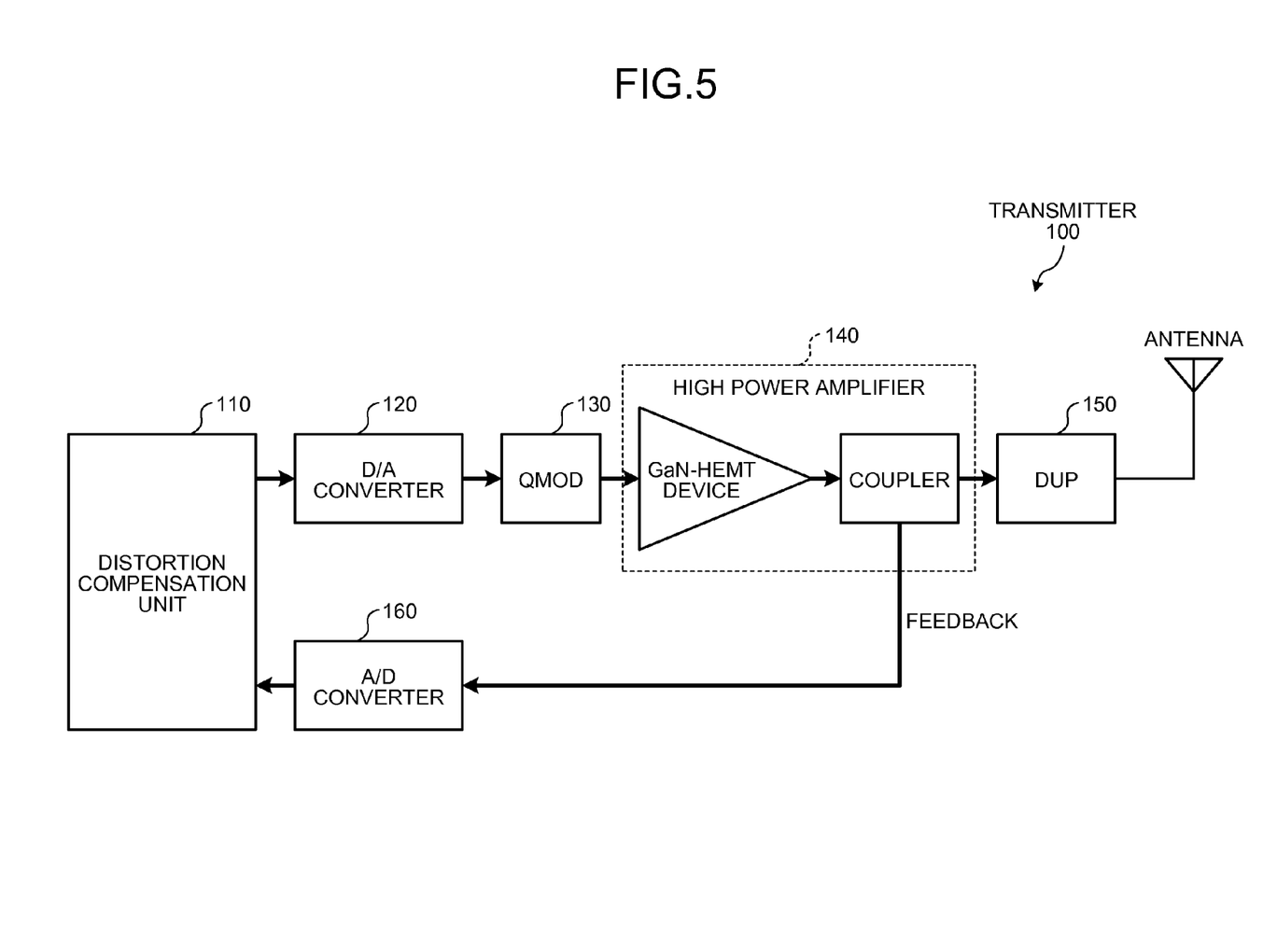
FIG. 5 is a diagram illustrating a configuration of the transmitter according to the embodiment of the present invention.

Next, a configuration of the transmitter according to the embodiment of the present invention is illustrated. FIG. 5 is a diagram illustrating a configuration of the transmitter according to the embodiment of the present invention. As illustrated in FIG. 5, a transmitter 100 includes a distortion compensation unit 110, a D/A converter 120, a QMOD 130, a high power amplifier 140, a DUP 150, and an A/D converter 160.

Among these components, the distortion compensation unit 110 is a processing unit that includes an APD or an FPGA. The distortion compensation unit 110 acquires information of a signal fed back from the high power amplifier 140, and compensates the distortion of the signal based on the acquired information.

The D/A converter 120 is a processing unit for acquiring a digital signal from the distortion compensation unit 110, converting the digital signal into an analog signal, and outputting the converted analog signal to the QMOD 130. The QMOD (quadrature modulator) 130 is a processing unit for executing quadrature modulation on the acquired signal when it acquires a signal from the D/A converter 120. The QMOD 130 outputs a quadrature-modulated signal to the high power amplifier 140.

The high power amplifier 140 acquires a signal from the QMOD 130 and amplifies the signal using the GaN-HEMT device. The high power amplifier 140 divides the amplified signal using a coupler and outputs the amplified signal to the DUP 150 and the A/D converter 160. In addition, as illustrated in FIG. 4, the high power amplifier 140 performs gain compensation based on the drain current of the GaN-HEMT device.

The DUP (Duplexer) 150 is an antenna-shared device and reduces the transmission loss of a signal output from the high power amplifier 140 or a signal received from an antenna. The A/D converter 160 is a processing unit for acquiring an analog signal from the high power amplifier 140, converting the acquired analog signal into a digital signal, and outputting the digital signal after conversion to the distortion compensation unit 110.

Figure 6:
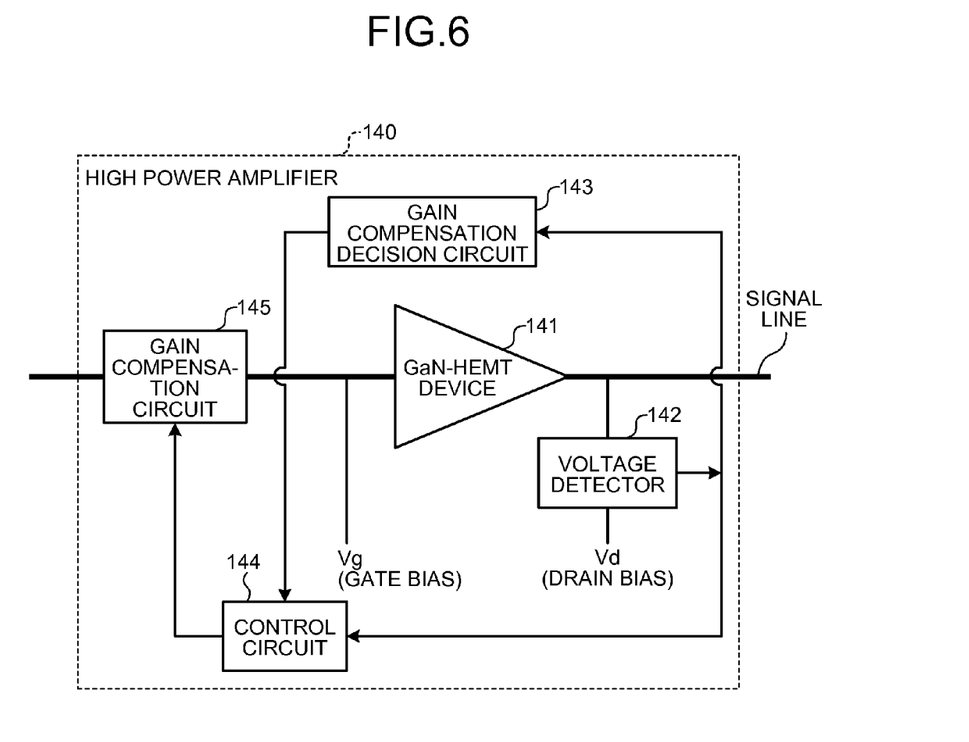
FIG. 6 is a diagram illustrating a schematic configuration of a high power amplifier according to the embodiment of the present invention.

Next, a schematic configuration of the high power amplifier 140 illustrated in FIG. 5 is explained. FIG. 6 is a diagram illustrating the schematic configuration of the high power amplifier 140 according to the embodiment of the present invention. As illustrated in FIG. 6, the high power amplifier 140 includes a GaN-HEMT device 141, a voltage detector 142, a gain compensation decision circuit 143, a control circuit 144, and a gain compensation circuit 145.

Among these components, the GaN-HEMT device 141 connected to Vg (gate bias) and Vd (drain bias) is a circuit to amplify a signal that the QMOD 130 illustrated in FIG. 5 outputs. The voltage detector 142 is a processing unit for detecting a current flowing to the drain terminal of the GaN-HEMT device 141 as a potential difference (voltage) by means of voltage conversion. The voltage detector 142 outputs the voltage value as a detection result to the gain compensation decision circuit 143 and the control circuit 144.

The gain compensation decision circuit 143 acquires the voltage value from the voltage detector 142 and decides whether or not to perform gain compensation based on the acquired voltage value. Specifically, the gain compensation decision circuit 143 decides to perform gain compensation if the voltage value is less than a prescribed value, and decides not to perform gain compensation if the voltage value is equal to or more than the prescribed value. The gain compensation decision circuit 143 outputs the decision result to the control circuit 144.

The control circuit 144 acquires the decision result from the gain compensation decision circuit 143 and acquires the voltage value from the voltage detector 142. The control circuit 144 further outputs the voltage value based on the decision result to the gain compensation circuit 145. Specifically, if the control circuit 144 acquires the decision result indicating gain compensation, the control circuit 144 outputs the voltage value to the gain compensation circuit 145. On the other hand, if the control circuit 144 acquires the decision result indicating no gain compensation, the control circuit 144 does not output the voltage value to the gain compensation circuit 145.

The gain compensation circuit 145 is a circuit for performing gain compensation on acquiring the voltage value from the control circuit 144, according to the acquired voltage value. For example, the gain compensation circuit 145 performs gain compensation by adjusting an attenuation amount of a signal, which is sent through a signal line, according to the voltage value.

Figure 7:
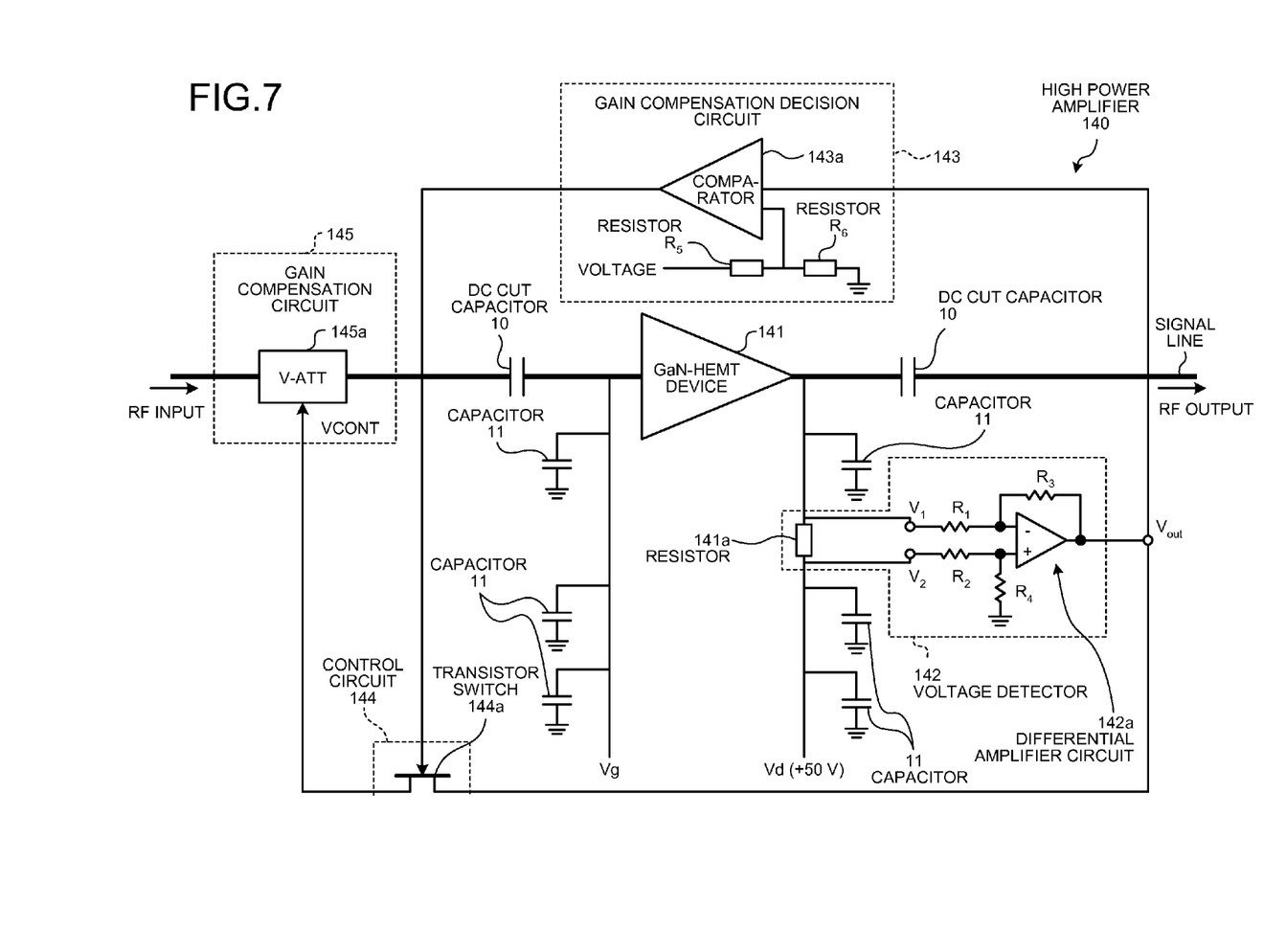
FIG. 7 is a diagram illustrating a detailed configuration of the high power amplifier according to the embodiment of the present invention.

Next, the configuration of the high power amplifier 140 illustrated in FIG. 6 is explained more specifically. FIG. 7 is a diagram illustrating the detailed configuration of the high power amplifier 140 according to the embodiment of the present invention. As illustrated in FIG. 7, the high power amplifier 140 includes the GaN-HEMT device 141, the voltage detector 142, the gain compensation decision circuit 143, the control circuit 144, and the gain compensation circuit 145. In addition, the signal line for sending a signal includes DC cut capacitors 10 for cutting the DC component of the signal.

The GaN-HEMT device 141 connected to the Vg (gate bias) and the Vd (drain bias) is a circuit for amplifying a signal that the QMOD 130 illustrated in FIG. 5 outputs. In addition, a line connecting the Vg and the GaN-HEMT device 141 is connected to a plurality of capacitors 11. Moreover, a line connecting the Vd and the GaN-HEMT device 141 is connected to a plurality of capacitors 11 and a resistor 141a.

The voltage detector 142 includes a differential amplifier circuit 142a including a plurality of resistors $R_1$ to $R_4$. The voltage detector 142 amplifies a voltage difference between a voltage $V_1$ applied from a line connected to one terminal of the resistor 141a and a voltage $V_2$ applied from a line connected to the other terminal of the resistor 141a. The voltage detector 142 outputs the amplified voltage difference $V_{out}$ to the gain compensation decision circuit 143 and the control circuit 144.

The gain compensation decision circuit 143 includes a comparator 143a and resistors $R_5$ and $R_6$. The gain compensation decision circuit 143 decides whether or not the value of the voltage difference $V_{out}$ is larger than a voltage applied from a line connecting the resistors $R_5$ and $R_6$. If the value of the voltage difference $V_{out}$ is smaller than the voltage applied from the line connecting the resistors $R_5$ and $R_6$, the gain compensation decision circuit 143 outputs an H signal to the control circuit 144. On the other hand, if the value of the voltage difference $V_{out}$ is larger than the voltage applied from the line connecting the resistors $R_5$ and $R_6$, the gain compensation decision circuit 143 outputs an L signal to the control circuit 144.

The control circuit 144 includes a transistor switch 144a. The control circuit 144 outputs the voltage difference $V_{out}$ to the gain compensation circuit 145 on acquiring the H signal from the gain compensation decision circuit 143. On the other hand, the control circuit 144 does not output the voltage difference $V_{out}$ to the gain compensation circuit 145 on acquiring the L signal from the gain compensation decision circuit 143.

The gain compensation circuit 145 includes a V-ATT (attenuator) 145a. The gain compensation circuit 145 performs gain compensation by giving an attenuation amount corresponding to the voltage difference $V_{out}$ to the signal when the gain compensation circuit 145 receives the voltage difference $V_{out}$ from the control circuit 144. It is assumed that a voltage gradient illustrating the relation between the voltage difference $V_{out}$ and the attenuation amount is adjusted based on a property of the gain compensation circuit 145 and a property of a differential amplifier circuit 142a.

Figure 8:
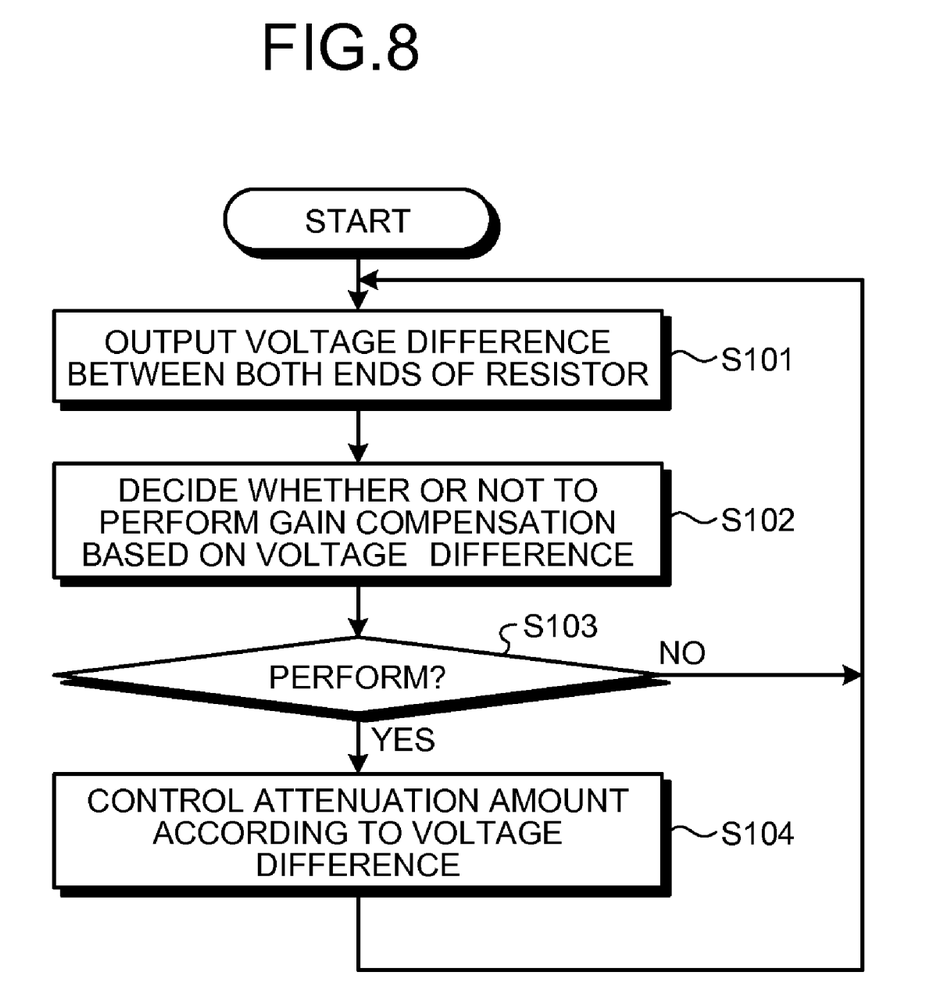
FIG. 8 is a flowchart illustrating a processing procedure of the high power amplifier according to the embodiment of the present invention.

Next, a processing procedure of the high power amplifier 140 of the embodiment of the present invention is explained. FIG. 8 is a flowchart illustrating the processing procedure of the high power amplifier 140 according to the embodiment of the present invention. As illustrated in FIG. 8, in the high power amplifier 140, the voltage detector 142 outputs the voltage difference between both ends of the resistor 141a connected to the Vd (Step S101).

The gain compensation decision circuit 143 decides whether or not to perform the gain compensation based on the voltage difference (Step S102). If the gain compensation decision circuit 143 decides not to perform the gain compensation (Step S103, No), the process proceeds to Step S101. On the other hand, if the gain compensation decision circuit 143 decides to perform the gain compensation (Step S103, Yes), the gain compensation circuit 145 controls the attenuation amount according to the voltage difference (Step S104), and the process proceeds to Step S101.

As described above, in the transmitter 100 according to the embodiment of the present invention, the high power amplifier 140 outputs the voltage difference based on the voltage between both ends of the resistor 141a, which is connected to the drain bias connected to the GaN-HEMT device. Then, whether to perform the gain compensation is decided based on the voltage difference. The high power amplifier 140 specifies the attenuation amount based on the voltage difference when performing the gain compensation and performs the gain compensation by giving the specified attenuation amount to the signal line. Therefore, a large gain fluctuation caused by the Idq drift can be efficiently compensated.

In the embodiment of the present invention, whether to perform the gain compensation is decided based on a voltage difference, and the specified attenuation amount corresponds to the voltage difference, by way of example. Alternatively, however, the drain current may be used in place of the voltage difference.

In the meantime, among the processings explained in the embodiment of the present invention, all or part of the processings can be done manually; or all or part of the processings explained to be done manually can also be done automatically using heretofore known methods. In addition, information including the processing procedures, control procedures, specific names, and various data and parameters illustrated in the above description and the drawings can be changed arbitrarily if not otherwise specified.

According to the amplifier of the embodiment, a large gain fluctuation caused by the Idq drift can be efficiently compensated.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An amplifier comprising:
   a voltage detector that monitors a value of drain current flowing to a drain terminal of a transistor which amplifies a signal using GaN, the voltage detector converting a voltage difference between two different points on a line connected to the drain terminal of the GaN to the value of drain current;
   a compensation decision unit that decides to perform gain compensation when the voltage difference detected by the voltage detector is less than a prescribed value, and decides not to perform gain compensation when the voltage difference is equal to or more than the prescribed value; and
   a gain compensation unit that performs the gain compensation according to the voltage difference when the compensation decision unit decides to perform the gain compensation.

2. The amplifier according to claim 1, wherein
   the gain compensation unit includes an attenuator that attenuates the signal, and
   the gain compensation unit performs the gain compensation by adjusting-an attenuation amount of the signal at the attenuator according to the voltage difference.

3. A transmitter comprising:
   a voltage detector that monitors a value of drain current flowing to a drain terminal of a transistor which amplifies a signal using GaN, the voltage detector converting a voltage difference between two different points on a line connected to the drain terminal of the GaN to the value of drain current;

a compensation decision unit that decides to perform gain compensation when the voltage difference detected by the voltage detector is less than a prescribed value, and decides not to perform gain compensation when the voltage difference is equal to or more than the prescribed value; and a gain compensation unit that performs the gain compensation according to the voltage difference when the compensation decision unit decides to perform the gain compensation.

4. The transmitter according to claim 3, wherein the gain compensation unit includes an attenuator that attenuates the signal, and the gain compensation unit performs the gain compensation by adjusting an attenuation amount of the signal at the attenuator according to the voltage difference.

5. A gain compensation method for an amplifier comprising:

monitoring a value of drain current flowing to a drain terminal of a transistor which amplifies a signal using GaN, the detecting converting a voltage difference between two different points on a line connected to the drain terminal of the GaN to the value of drain current;

deciding to perform gain compensation when the voltage difference detected in the detecting is less than a prescribed value, and not to perform gain compensation when the voltage difference is equal to or more than the prescribed value; and performing the gain compensation according to the voltage difference when it is decided to perform the gain compensation in the deciding.

6. The gain compensation method according to claim 5, wherein the performing includes attenuating the signal by an attenuator, and the performing includes performing the gain compensation by adjusting an attenuation amount of the signal at the attenuator according to the voltage difference.

* * * * *